(12) United States Patent
Ito et al.

(10) Patent No.: US 8,125,079 B2
(45) Date of Patent: Feb. 28, 2012

(54) MOLDED SEMICONDUCTOR DEVICE, APPARATUS FOR PRODUCING THE SAME, AND METHOD FOR MANUFACTURING THE SAME

(75) Inventors: Tetsuo Ito, Osaka (JP); Takayuki Yoshida, Shiga (JP); Toshiyuki Fukuda, Kyoto (JP); Takao Ochi, Shiga (JP)

(73) Assignee: Panasonic Corporation, Osaka (JP)

( * ) Notice: Subject to any disclaimer, the term of this patent is extended or adjusted under 35 U.S.C. 154(b) by 190 days.

(21) Appl. No.: 11/806,923

(22) Filed: Jun. 5, 2007

(65) Prior Publication Data

US 2008/0029930 A1 Feb. 7, 2008

(30) Foreign Application Priority Data

Jun. 20, 2006 (JP) ................................. 2006-169477

(51) Int. Cl.
*H01L 23/34* (2006.01)
*H01L 21/00* (2006.01)

(52) U.S. Cl. ................. 257/723; 257/724; 257/E23.132; 257/E23.133; 438/127

(58) Field of Classification Search .................. 438/127, 438/124, 787, 126; 257/787–794, 723–724, 257/E23.132, E23.133; 264/272.14, 272.17; 425/546, 556
See application file for complete search history.

(56) References Cited

U.S. PATENT DOCUMENTS

| | | | | |
|---|---|---|---|---|
| 5,077,237 A | * | 12/1991 | Hara | 264/272.17 |
| 5,665,281 A | * | 9/1997 | Drummond | 264/39 |
| 5,998,243 A | * | 12/1999 | Odashima et al. | 438/127 |
| 6,111,306 A | * | 8/2000 | Kawahara et al. | 257/666 |
| 6,433,420 B1 | * | 8/2002 | Yang et al. | 257/712 |
| 6,498,055 B2 | * | 12/2002 | Fukuda et al. | 438/127 |
| 7,141,886 B2 | * | 11/2006 | Dimaano et al. | 257/796 |
| 2002/0195692 A1 | * | 12/2002 | Yamada et al. | 257/669 |
| 2003/0034568 A1 | * | 2/2003 | Chai et al. | 257/788 |
| 2003/0087478 A1 | * | 5/2003 | Kasuga et al. | 438/112 |
| 2003/0218262 A1 | * | 11/2003 | Saga | 257/787 |
| 2004/0026823 A1 | * | 2/2004 | Thummel | 264/272.14 |
| 2004/0072389 A1 | * | 4/2004 | Chen et al. | 438/127 |
| 2005/0179125 A1 | * | 8/2005 | Cheah et al. | 257/706 |
| 2006/0035408 A1 | * | 2/2006 | Derderian | 438/106 |

FOREIGN PATENT DOCUMENTS

| JP | 2000-124239 | 4/2000 |
|---|---|---|
| JP | 2005-347514 | 12/2005 |

* cited by examiner

*Primary Examiner* — Kevin Parendo
(74) *Attorney, Agent, or Firm* — Steptoe & Johnson LLP

(57) ABSTRACT

A resin molding mold 20 with a cavity 21 has a resin injection port 29*a* from which a molding resin 25 is injected toward the cavity 21, and an air release port 30*a* from which air from the cavity 21 is released during resin injection. Not only the resin injection port 29*a* but also the air release port 30*a* is formed in a top surface portion 21*a* of the cavity 21. Thus, even if a resin burr remains in the resin injection port 29*a* or the air release port 30*a*, it can be prevented from adhering to an external terminal 4A provided on a front surface portion 2*a* of the substrate 2.

3 Claims, 15 Drawing Sheets

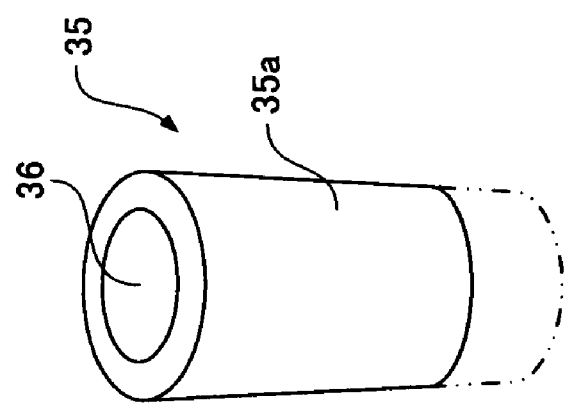
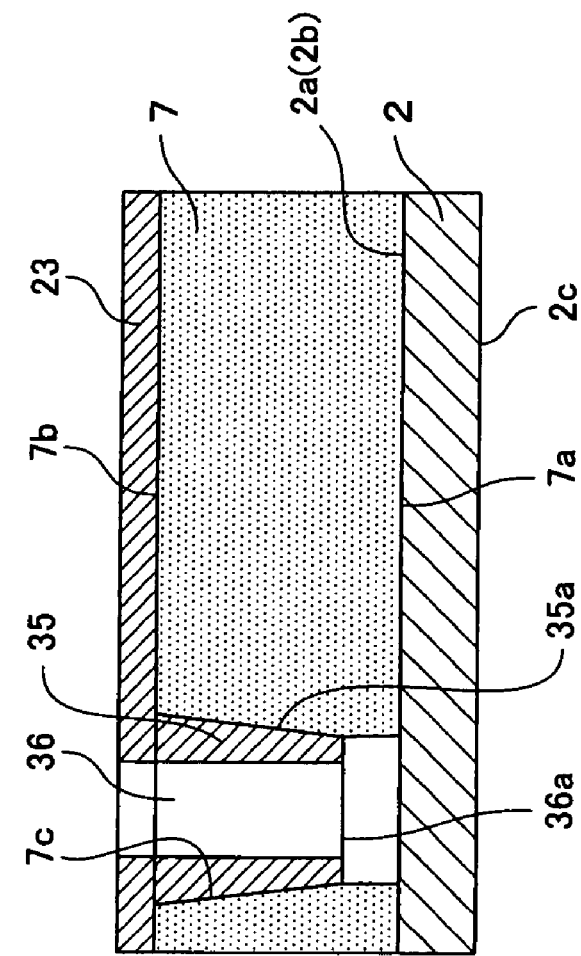

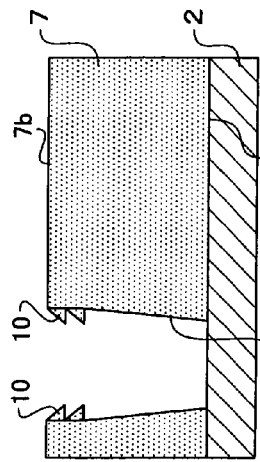
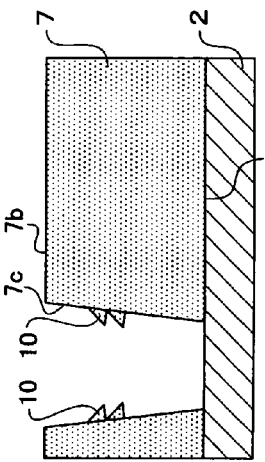
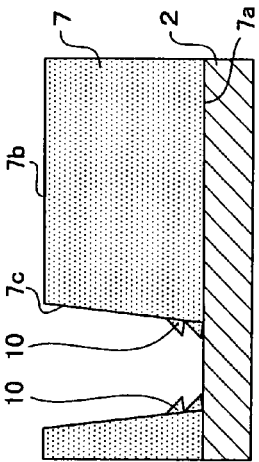
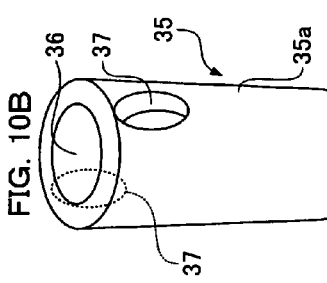
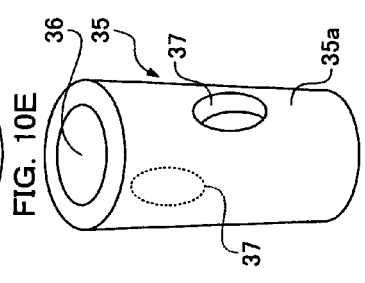
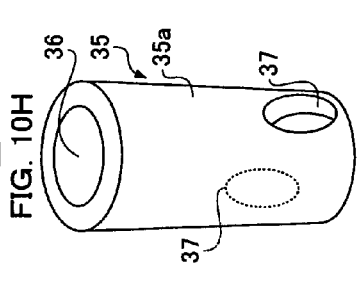
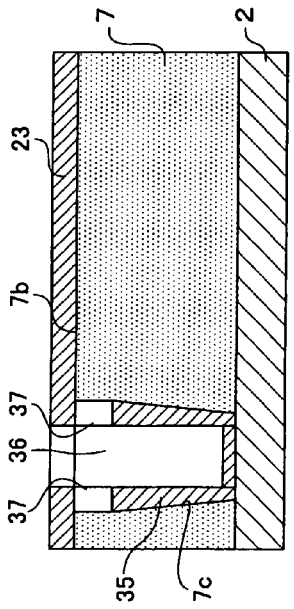
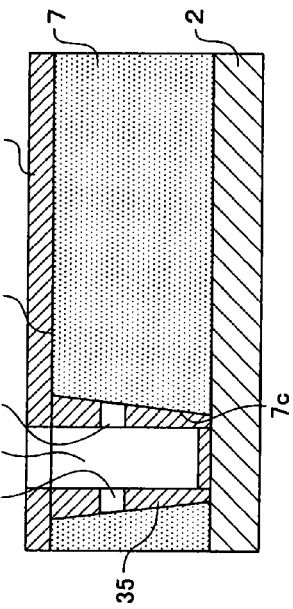
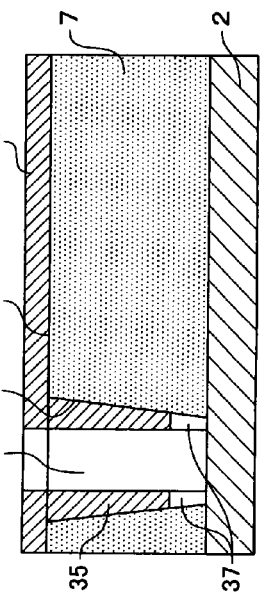

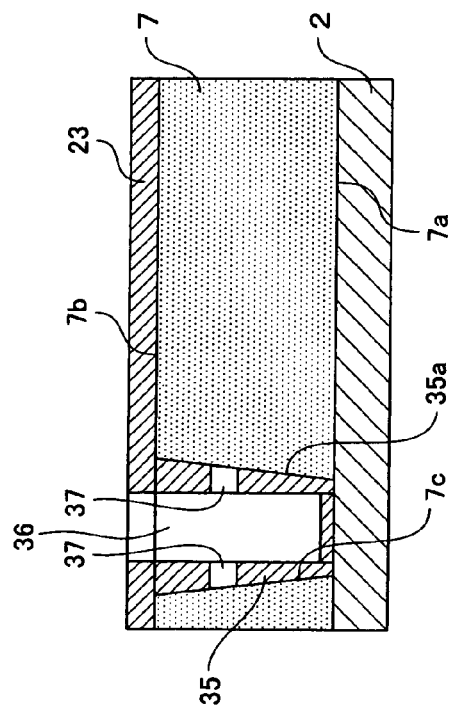
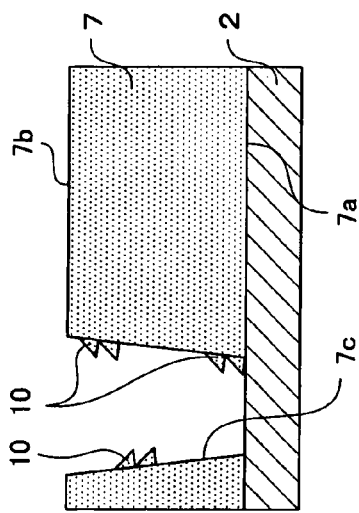
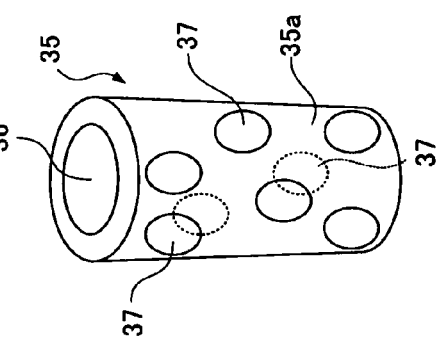
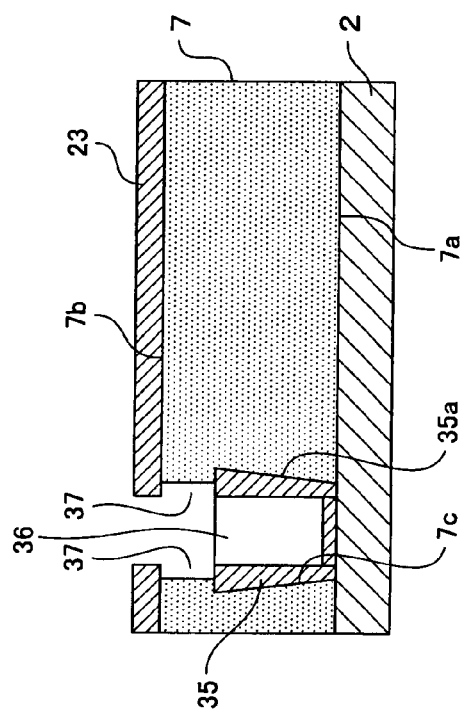
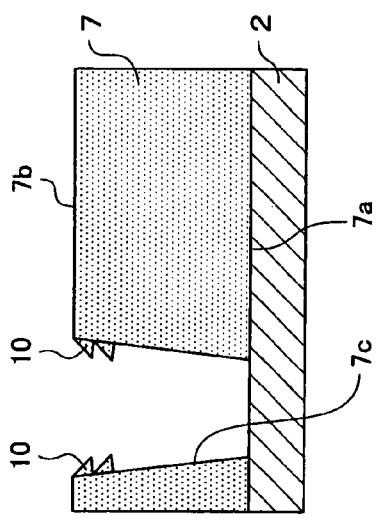
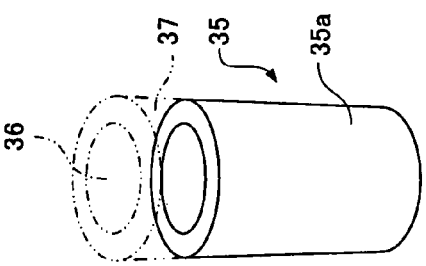

MOLDED SEMICONDUCTOR DEVICE, APPARATUS FOR PRODUCING THE SAME, AND METHOD FOR MANUFACTURING THE SAME

FIELD OF THE INVENTION

The present invention relates to resin molding semiconductor devices that are applicable as electronic parts in the field of small electronic equipment including digital electric appliances and mobile phones, and methods and production equipments of resin molding semiconductor devices.

BACKGROUND OF THE INVENTION

Conventional resin molding semiconductor devices have been manufactured by mounting semiconductor elements on a substrate, connecting electrodes on each semiconductor element to electrodes on the substrate via bonding wires, and molding the integrated semiconductor device with resin so as to wrap it. Specifically, the conventional resin molding semiconductor device has been manufactured by executing a resin molding process (transfer mold) comprising installing the semiconductor device in a cavity of a mold, injecting and filling a molten resin into the cavity through a gate, and hardening the resin.

As the advanced information-oriented society develops, stronger demands have been made to reduce the sizes and thicknesses of and to improve the functions of a group of products in the small electronic equipment field which are used in the advanced information-oriented society. In connection with the manufacture of semiconductor elements, key devices for the group of products, a reduction in the sizes and pitches of semiconductor elements has been strongly demanded. Resin molding semiconductor devices with the semiconductor elements mounted thereon are strongly demanded to have a structure including long wires or narrow pat pitch connections and in which electrodes on the semiconductor elements are electrically connected to many electrodes mounted on the substrate.

Requests have also been made for structures such as POP (Package On Package) in which a plurality of semiconductor devices are stacked and electrically connected together in order to provide improved functions.

A common method for manufacturing the resin molding semiconductor device has been to inject resin into the cavity of the mold through the side surface of the cavity. However, with this method, during resin injection, the resin flows along the direction in which wires are arranged. Consequently, a wire coming into contact with the resin may be swept away by the resin to flow toward the adjacent wire. In this case, the wires contact each other to cause a short circuit.

A manufacturing method for inhibiting such a problem is proposed by, for example, Japanese Patent Laid-Open No. 2005-347514. According to this method, a gate is formed on a surface of the cavity which is located opposite a front surface of the semiconductor element and the resin is ejected from the gate toward the front surface of the semiconductor element.

With reference to FIGS. 14A to 14C and 15, description will be given of a method for manufacturing such a conventional resin molding semiconductor device as described above. FIG. 14A is a plan view of a resin molding semiconductor device having a gate, that is, a resin injection port, formed on a surface of a cavity which is located opposite a front surface of each semiconductor element. FIG. 14B is a sectional view of the resin molding semiconductor device taken along line A-A' in FIG. 14A. FIG. 14C is an enlarged plan view of a portion B in FIG. 14A. FIG. 15 is a sectional view showing a production equipment of the resin molding semiconductor device.

As shown in FIGS. 14A to 14C and 15, the resin molding semiconductor device is manufactured by mounting a semiconductor element 52 on a substrate 51 and injecting a molding resin 54 toward a front surface of the semiconductor element 52 through a gate (resin injection port) 53 formed on a surface of a cavity 64 in molds 61, 62, and 63 which is located opposite the semiconductor element 52, to fill the cavity 64 with the molding resin 54. Here, reference numeral 55 in FIG. 14B denotes a wire, and reference numeral 56 denotes a solder ball. In FIG. 15, reference numerals 61, 62, and 63 denote an upper mold, an intermediate mold, and a lower mold. Reference numeral 65 denotes a plunger that pushes the molding resin 54 into the cavity 64 through a runner 66. Reference numeral 67 denotes an air vent portion (air release passage) formed in an area of the upper mold 61 which is located opposite a front surface portion (top surface portion) of the substrate 51.

In connection with such a resin molding semiconductor device, for example, Japanese Patent Laid-Open No. 2000-124239 proposes the production of a resin molding semiconductor device involving executing one molding process to mold a plurality of semiconductor elements 52 in order to reduce production time and subsequently cutting the semiconductor elements 52 off from one another to obtain the finished products.

To implement POP (Package On Package) on the conventional resin molding semiconductor device, external terminals need to be provided on a front surface of the substrate 51. However, with the conventional method for manufacturing a semiconductor device, air resulting from injection of the molding resin 54 is discharged from the air vent portion 67, formed on the side surface of the cavity 64. Thus, unfortunately, resin burrs 57 (see FIG. 14C) may be discharged together with air and adhere to the external terminals on the substrate 51. This may prevent electric connections.

Further, when an attempt is made to locate the external terminals in an area where no resin burrs 57 will be formed, the arrangement of the external terminals is limited. This may disadvantageously complicate wiring to increase manufacturing costs or increase the area of the substrate, preventing the resin molding semiconductor device from being miniaturized.

Another problem is that the resin burrs 57 may adhere to the external electrodes to reduce yield, preventing improvement of productivity.

DISCLOSURE OF THE INVENTION

The present invention solves the above problems. An object of the present invention is to provide a production equipment and method for manufacturing a resin molding semiconductor device which enables resin molding semiconductor devices to be manufactured with an appropriate yield, allowing productivity to be improved, the resin molding semiconductor device having external terminals on the same front surface portion of a substrate on which semiconductor elements are mounted, as well as a resin molding semiconductor device manufactured using the above method and production equipment.

To accomplish the above object, the production equipment and method for manufacturing a resin molding semiconductor device and the resin molding semiconductor device in accordance with the present invention have the features described below.

A production equipment of a resin molding semiconductor device in accordance with the present invention includes a substrate having a front surface portion with a chip mounting area in which a semiconductor element is mounted, an electrode provided on the front surface portion around an outer periphery of the chip mounting area and electrically connected by a connector to an electrode provided on the semiconductor element, a front surface portion side external terminal provided on the front surface portion around an outer periphery of the electrode, and a back surface portion side external terminal on a back surface portion, an area of the front surface portion of the substrate other than an area in which front surface portion side external element is provided, the semiconductor element, and the connector being molded with resin. The substrate with the semiconductor element mounted thereon is placed inside the production equipment when the molding resin is injected, and a resin molding mold having a cavity that is a molding resin injection space is provided. The mold has a resin injection port from which the molding resin is injected into the cavity and an air release port from which air from the cavity is released during resin injection. The resin injection port is formed in an area of the mold which corresponds to a top surface portion of the cavity, and the air release port is formed on the cavity top surface of the mold in an area different from the resin injection port.

The production equipment of the resin molding semiconductor device injects the molding resin into the cavity through the resin injection port, formed in the area of the mold which corresponds to the top surface portion of the cavity, to fill the cavity with the resin, while discharging the air in the cavity through the air release port, formed in the area on the cavity top surface portion of the mold which is different from the resin injection port during resin injection. Thus, even if a resin burr remains in the resin injection port in the resin molding portion or in an area of the resin molding portion which corresponds to the air release port, it is formed on a top surface portion of the resin molding portion, which is located away from the front surface portion of the substrate. This makes it possible to prevent the resin burr from adhering to the front surface portion side external terminal, provided on the front surface portion of the substrate. The resin molding semiconductor device can thus be manufactured with a high yield, allowing productivity to be improved.

A production equipment of a resin molding semiconductor device in accordance with the present invention includes a substrate having a front surface portion with a chip mounting area in which a semiconductor element is mounted, an electrode provided on the front surface portion around an outer periphery of the chip mounting area and electrically connected by a connector to an electrode provided on the semiconductor element, a front surface portion side external terminal provided on the front surface portion around an outer periphery of the electrode, and a back surface portion side external terminal on a back surface portion, an area of the front surface portion of the substrate other than an area in which front surface portion side external element is provided, the semiconductor element, and the connector being molded with resin. The substrate with the semiconductor element mounted thereon is placed inside the production equipment when the molding resin is injected, and a resin molding mold having a cavity that is a molding resin injection space is provided. The mold has a resin injection port from which the molding resin is injected into the cavity and an air release port from which air from the cavity is released during resin injection. The resin injection port is formed in an area of the mold which corresponds to a top surface portion of the cavity, and the air release port is formed on a surface of the mold which is located opposite the front surface portion of the substrate.

The production equipment of the resin molding semiconductor device injects the molding resin into the cavity through the resin injection port, formed in the area of the mold which corresponds to the top surface portion of the cavity, to fill the cavity with the resin, while discharging the air in the cavity through the air release port, formed on the surface of the mold which is located opposite the front surface portion of the substrate. Thus, even if a resin burr remains in the resin injection port in the resin molding portion or in an area of the resin molding portion which corresponds to the air release port, it is formed on a top surface portion of the resin molding portion, which is located away from the front surface portion of the substrate, or in an area of the mold which correspond to the top surface portion of the cavity. This makes it possible to prevent the resin burr from adhering to the front surface portion side external terminal, provided on the front surface portion of the substrate. The resin molding semiconductor device can thus be manufactured with a high yield, allowing productivity to be improved.

A production equipment of a resin molding semiconductor device in accordance with the present invention includes a substrate having a front surface portion with a chip mounting area in which a semiconductor element is mounted, an electrode provided on the front surface portion around an outer periphery of the chip mounting area and electrically connected by a connector to an electrode provided on the semiconductor element, a front surface portion side external terminal provided on the front surface portion around an outer periphery of the electrode, and a back surface portion side external terminal on a back surface portion, an area of the front surface portion of the substrate other than an area in which the front surface portion side external element is provided, the semiconductor element, and the connector being molded with resin. The substrate with the semiconductor element mounted thereon is placed inside the production equipment when the molding resin is injected, and a resin molding mold having a cavity that is a molding resin injection space is provided. The mold has a resin injection port formed in an area thereof which corresponds to a top surface portion of the cavity and from which the molding resin is injected into the cavity. The mold has a cylindrical pin extending from the cavity top surface portion of the mold toward the front surface portion of the substrate and through the cavity and serving as an auxiliary mold. The pin has the air release port formed opposite the cavity and an air release passage joined to the air release port.

The production equipment of the resin molding semiconductor device injects the molding resin into the cavity through the resin injection port, formed in the area of the mold corresponding to the top surface portion of the cavity, to fill the cavity with the resin, while discharging the air in the cavity through the air release passage and air release port, formed in the cylindrical pin extending from the cavity top surface portion of the mold into the cavity and serving as the auxiliary mold. Thus, even if a resin burr remains in the resin injection port in the resin molding portion or in an area of the resin molding portion which corresponds to the air release passage, it is formed on a top surface portion of the resin molding portion, which is located away from the front surface portion of the substrate, or in the air release port of the pin. This makes it possible to prevent the resin burr from adhering to the front surface portion side external terminal, provided on the front surface portion of the substrate. The resin molding semiconductor device can thus be manufactured with a high yield, allowing productivity to be improved. Further, this production equipment forms a recessed portion in the molding resin portion which corresponds to the pin, so that the molding resin portion has a relatively deformable shape. Compared to the case where the molding resin portion has no recessed portion or the like, this arrangement makes it possible to relax stress resulting from hardening reaction shrinkage and thermal shrinkage which may occur during resin molding. This in turn enables a reduction in the warpage of the molding resin portion and thus the molding resin semiconductor device.

Further, in the production equipment of a resin molding semiconductor device in accordance with the present invention, the pin has a draft-angle inclined surface formed on an outer peripheral surface thereof so that a cross section in the outer peripheral surface decreases as the inclined surface approaches the front surface portion of the substrate to allow the pin to be easily removed from a molding resin portion.

This arrangement enables the pin to be easily removed after the resin molding process, allowing working efficiency to be improved.

A production equipment of a resin molding semiconductor device in accordance with the present invention includes a substrate having a front surface portion with a chip mounting area in which a semiconductor element is mounted, an electrode provided on the front surface portion around an outer periphery of the chip mounting area and electrically connected by a connector to an electrode provided on the semiconductor element, a front surface portion side external terminal provided on the front surface portion around an outer periphery of the electrode, and a back surface portion side external terminal on a back surface portion, an area of the front surface portion of the substrate other than an area in which the front surface portion side external element is provided, the semiconductor element, and the connector being molded with resin. The substrate with the semiconductor element mounted thereon is placed inside the production equipment when the molding resin is injected, and a resin molding mold having a cavity that is a molding resin injection space is provided. The mold has a resin injection port from which the molding resin is injected toward the cavity and an air release port from which air from the cavity is released during resin injection. The resin injection port is formed in an area of the mold which corresponds to a top surface portion of the cavity, and the air release port is formed on a surface of the mold which is located opposite a back surface portion of the substrate, at a position where the air release port is joined to an air releasing hole formed on the substrate.

The production equipment of the resin molding semiconductor device injects the molding resin into the cavity through the resin injection port, formed in the area of the mold corresponding to the top surface portion of the cavity, to fill the cavity with the resin, while discharging the air in the cavity through the air release hole, formed in the substrate, and the air release port, formed so as to connect to the hole. Thus, even if a resin burr remains in the resin injection port in the resin molding portion or in an area of the resin molding portion which corresponds to the air release port, it is formed on a top surface portion of the resin molding portion, which is located away from the front surface portion of the substrate, or in the air release hole in the substrate. This makes it possible to prevent the resin burr from adhering to the external terminal, provided on the front surface portion of the substrate. The resin molding semiconductor device can thus be manufactured with a high yield, allowing productivity to be improved.

Further, in the production equipment of a resin molding semiconductor device in accordance with the present invention, the resin injection port is formed substantially in the center of a molding resin portion corresponding to the semiconductor element, in a plan view in which the molding resin portion is viewed in a thickness direction thereof, and a plurality of air release ports are formed around the resin injection port in the plan view in which the molding resin portion is viewed in the thickness direction thereof.

This arrangement allows a molding resin to be appropriately injected into a cavity through the resin injection port, formed substantially in the center of the molding resin portion in the plan view in which the molding resin portion is viewed in the thickness direction thereof. Further, the plurality of air release ports are formed around the resin injection port, allowing air in the cavity to be appropriately released from the air release ports.

A method for manufacturing a resin molding semiconductor device in accordance with the present invention comprises forming an electrode in a front surface portion of a substrate having a chip mounting area in which a semiconductor element is mounted, at a position around an outer periphery of the chip mounting area and forming a front surface portion side external terminal on the front surface portion of the substrate around an outer periphery of the electrode and a back surface portion side external terminal on a back surface portion of the substrate, mounting the semiconductor element with the electrode in the chip mounting area of the substrate, electrically connecting the electrode on the substrate to the electrode on the semiconductor element via a connector, placing the substrate with the semiconductor element mounted thereon in a mold provided with a cavity that is a molding resin injection space and injecting a molding resin into the cavity through a resin injection port formed in a first area of the mold which corresponds to a top surface portion of the cavity, while releasing air through an air release port formed in a second area of the mold which corresponds to the top surface portion of the cavity, so that the molding resin covers the semiconductor element, the front surface portion of the substrate except for the front surface portion side external terminal, that is, the chip mounting area and electrode, and the connector.

This method injects the molding resin into the cavity through the resin injection port, formed in the area of the mold which corresponds to the top surface portion of the cavity, to fill the cavity with the resin, while discharging the air in the cavity through the air release port, formed in the area of the mold which corresponds to the top surface portion of the cavity. Thus, even if a resin burr remains in the resin injection port in the resin molding portion or in an area of the resin molding portion which corresponds to the air release port, it is formed on a top surface portion of the resin molding portion, which is located away from the front surface portion of the substrate. This makes it possible to prevent resin burrs from adhering to the front surface portion side external terminal, provided on the front surface portion of the substrate. Resin molding semiconductor devices can thus be manufactured with a high yield, allowing productivity to be improved.

A method for manufacturing a resin molding semiconductor device in accordance with the present invention comprises forming an electrode in a front surface portion of a substrate having a chip mounting area in which a semiconductor element is mounted, at a position around an outer periphery of the chip mounting area and forming a front surface portion side external terminal on the front surface portion of the substrate around an outer periphery of the electrode and a back surface portion side external terminal on a back surface portion of the substrate, mounting the semiconductor element with the electrode in the chip mounting area of the substrate, electrically connecting the electrode on the substrate to the electrode on the semiconductor element via a connector, placing the substrate with the semiconductor element mounted thereon in a mold provided with a cavity that is a molding resin injection space and injecting a molding resin into the cavity through a resin injection port formed in an area of the mold which corresponds to a top surface portion of the cavity, while releasing air from an air release port formed on a surface of the mold which is located opposite the front surface portion of the substrate, so that the molding resin covers the semiconductor element, the front surface portion of the substrate except for the front surface portion side external terminal, that is, the chip mounting area and electrode, and the connector.

This method injects the molding resin into the cavity through the resin injection port, formed in the area of the mold which corresponds to the top surface portion of the cavity, to fill the cavity with the resin, while discharging the air in the cavity through the air release port, formed on the surface of the mold which is located opposite the front surface portion of the substrate. Thus, even if a resin burr remains in the resin injection port in the resin molding portion or in an area of the resin molding portion which corresponds to the air release port, it is formed on a top surface portion of the resin molding portion, which is located away from the front surface portion of the substrate, or in an area of the mold which corresponds to the top surface portion of the cavity. This makes it possible to prevent resin burrs from adhering to the front surface portion side external terminal, provided on the front surface portion of the substrate. Resin molding semiconductor devices can thus be manufactured with a high yield, allowing productivity to be improved.

Further, a method for manufacturing a resin molding semiconductor device in accordance with the present invention comprises forming an electrode in a front surface portion of a substrate having a chip mounting area in which a semiconductor element is mounted, at a position around an outer periphery of the chip mounting area and forming a front surface portion side external terminal on the front surface portion of the substrate around an outer periphery of the electrode and a back surface portion side external terminal on a back surface portion of the substrate, mounting the semiconductor element with the electrode in the chip mounting area of the substrate, electrically connecting the electrode on the substrate to the electrode on the semiconductor element via a connector, placing the substrate with the semiconductor element mounted thereon in a mold provided with a cavity that is a molding resin injection space and injecting a molding resin into the cavity through a resin injection port formed in a cavity top surface portion of the cavity, while releasing air from an air release port formed in a cylindrical pin extending from the cavity top surface portion into the cavity and serving as an auxiliary mold, so that the molding resin covers the semiconductor element, the front surface portion of the substrate except for the front surface portion side external terminal, that is, the chip mounting area and electrode, and the connector.

This method injects the molding resin into the cavity through the resin injection port formed in the area of the mold which corresponds to the top surface portion of the cavity, while discharging the air in the cavity through the air releasing passage and air release port formed in the cylindrical pin extending from the cavity top surface portion of the cavity into the cavity and serving as an auxiliary mold. Thus, even if a resin burr remains in the resin injection port in the resin molding portion or in an area of the resin molding portion which corresponds to the air release passage, it is formed on the top surface portion of the resin molding portion, which is located away from the front surface portion of the substrate, or in the air release port in the pin. This makes it possible to prevent resin burrs from adhering to the front surface portion side external terminal, provided on the front surface portion of the substrate. Resin molding semiconductor devices can thus be manufactured with a high yield, allowing productivity to be improved. Further, this production equipment forms a recessed portion in the molding resin portion which corresponds to the pin, so that the molding resin portion has a relatively deformable shape. Compared to the case where the molding resin portion has no recessed portion or the like, this arrangement makes it possible to relax stress resulting from hardening reaction shrinkage and thermal shrinkage which may occur during resin molding. This in turn enables a reduction in the warpage of the molding resin portion and thus the molding resin semiconductor device.

A method for manufacturing a resin molding semiconductor device in accordance with the present invention comprises forming an electrode in a front surface portion of a substrate having a chip mounting area in which a semiconductor element is mounted, at a position around an outer periphery of the chip mounting area and forming a front surface portion side external terminal on the front surface portion of the substrate around an outer periphery of the electrode and a back surface portion side external terminal on a back surface portion of the substrate, mounting the semiconductor element with the electrode in the chip mounting area of the substrate, electrically connecting the electrode on the substrate to the electrode on the semiconductor element via a connector, placing the substrate with the semiconductor element mounted thereon in a mold provided with a cavity that is a molding resin injection space and injecting a molding resin into the cavity through a resin injection port formed in a cavity top surface portion, while releasing air from an air releasing through-hole formed through the substrate in a substrate thickness direction and an air release port formed in the mold so as to connect to a substrate back surface portion opening portion of the through-hole, so that the molding resin covers the semiconductor element, the front surface portion of the substrate except for the front surface portion side external terminal, that is, the chip mounting area and electrode, and the connector.

This method injects the molding resin into the cavity through the resin injection port, formed in the area of the mold which corresponds to the top surface portion of the cavity, to fill the cavity with the resin, while discharging the air in the cavity through the air releasing hole, formed in the substrate, and the air release port, connected to the hole. Thus, even if a resin burr remains in the resin injection port in the resin molding portion or in an area of the resin molding portion which corresponds to the air release port, it is formed on a top surface portion of the resin molding portion, which is located away from the front surface portion of the substrate, or in the air release hole in the substrate. This makes it possible to prevent resin burrs from adhering to the external terminal, provided on the front surface portion of the substrate. Resin molding semiconductor devices can thus be manufactured with a high yield, allowing productivity to be improved.

With the method for manufacturing a resin molding semiconductor device in accordance with the present invention, a plurality of chip mounting areas in which semiconductor elements are mounted are formed on a single substrate, and the substrate molded with resin is divided into substrates with respective unitary semiconductor elements to form individual resin molding semiconductor devices.

This method enables a plurality of resin molding semiconductor devices to be efficiently manufactured.

A resin molding semiconductor device in accordance with the present invention comprises a substrate, a chip mounting area on a front surface portion of the substrate in which a semiconductor element is mounted, an electrode disposed around an outer periphery of the chip mounting area, a front surface portion side external terminal disposed around an outer periphery of the electrode, and a back surface portion side external terminal on the back surface portion of the substrate, the semiconductor element with the electrode being mounted in the chip mounting area of the substrate, the electrode on the substrate being electrically connected to the electrode on the semiconductor element via a connector, the semiconductor element, the front surface portion of the substrate except for the front surface portion side external terminal, and the connector being covered with a molding resin portion. A resin injection port impression with the molding resin injected therein and an air release port impression from which air is released during resin injection are present in a top surface portion of the molding resin portion which is located opposite a bottom surface portion of the molding resin portion contacting the front surface portion of the substrate; each of the resin injection port impression and the air release port impression has a recessed and projecting shape.

A resin molding semiconductor device in accordance with the present invention comprises a substrate, a chip mounting area on a front surface portion of the substrate in which a semiconductor element is mounted, an electrode disposed around an outer periphery of the chip mounting area, a front surface portion side external terminal disposed around an outer periphery of the electrode, and a back surface portion side external terminal on the back surface portion of the substrate, the semiconductor element with the electrode being mounted in the chip mounting area of the substrate, the electrode on the substrate being electrically connected to the electrode on the semiconductor element via a connector, the semiconductor element, the front surface portion of the substrate except for the front surface portion side external terminal, and the connector being covered with a molding resin portion. A resin injection port impression with the molding resin injected therein and having a recessed and projecting shape is present in a top surface portion of the molding resin portion which is located opposite a bottom surface portion of the molding resin portion contacting the front surface portion of the substrate. A recessed portion is formed which is recessed from the top surface portion of the molding resin portion toward the bottom surface portion. An air release port impression from which air is released during resin injection is present opposite the recessed portion.

In this arrangement, the molding resin portion is provided with the recessed portions and thus has a relatively deformable shape. Compared to the case where the molding resin portion has no recessed portion or the like, this arrangement makes it possible to relax stress resulting from hardening reaction shrinkage and thermal shrinkage which may occur during resin molding. This in turn enables a reduction in the warpage of the molding resin portion and thus the molding resin semiconductor device.

A resin molding semiconductor device in accordance with the present invention comprises a substrate, a chip mounting area on a front surface portion of the substrate in which a semiconductor element is mounted, an electrode disposed around an outer periphery of the chip mounting area, a front surface portion side external terminal disposed around an outer periphery of the electrode, and a back surface portion side external terminal on the back surface portion of the substrate, the semiconductor element with the electrode being mounted in the chip mounting area of the substrate, the electrode on the substrate being electrically connected to the electrode on the semiconductor element via a connector, the semiconductor element, the front surface portion of the substrate except for the front surface portion side external terminal, and the connector being covered with a molding resin portion. A resin injection port impression with the molding resin injected therein and having a recessed and projecting shape is present in a top surface portion of the molding resin portion which is located opposite a bottom surface portion of the molding resin portion contacting the front surface portion of the substrate. The substrate has a through-hole formed through the substrate in a thickness direction. An air release port impression of the molding resin portion from which air is released during resin injection is present in an area of the substrate in which the through-hole is formed.

In the resin molding semiconductor device in accordance with the present invention, the through-hole in the substrate is formed in an area corresponding to a corner of the resin molding portion which appears rectangular in a plan view.

BRIEF DESCRIPTION OF THE DRAWINGS

FIGS. 1A to 1C show a resin molding semiconductor device manufactured by a method and production equipment for manufacturing a resin molding semiconductor device in accordance with a first embodiment of the present invention, wherein FIG. 1A is a plan view of the resin molding semiconductor device, FIG. 1B is a simplified sectional view of the resin molding semiconductor device taken along line A-A' in FIG. 1A, and FIG. 1C is a simplified sectional view of the resin molding semiconductor device taken along line B-B' in FIG. 1A;

FIGS. 5A to 5C show a resin molding semiconductor device manufactured by a method and production equipment for manufacturing a resin molding semiconductor device in accordance with a second embodiment of the present invention, wherein FIG. 5A is a plan view of the resin molding semiconductor device, FIG. 5B is a simplified sectional view of the resin molding semiconductor device taken along line A-A' in FIG. 5A, and FIG. 5C is a simplified sectional view of the resin molding semiconductor device taken along line B-B' in FIG. 5A;

FIGS. 7A and 7B are a sectional view of the resin molding semiconductor device with pins installed therein and the pin, respectively;

FIGS. 8A to 8C show a resin molding semiconductor device manufactured by a method and production equipment for manufacturing a resin molding semiconductor device in accordance with a third embodiment of the present invention, wherein FIG. 8A is a plan view of the resin molding semiconductor device, FIG. 8B is a simplified sectional view of the resin molding semiconductor device taken along line A-A' in FIG. 8A, and FIG. 8C is a simplified sectional view of the resin molding semiconductor device taken along line B-B' in FIG. 8A;

FIGS. 10A, 10D, and 10G are each a sectional view of a variation of the resin molding semiconductor device with the pin installed therein, FIGS. 10B, 10E, and 10H are each a perspective view of the pin, and FIGS. 10C, 10F, and 10I are each a sectional view of a variation of the resin molding semiconductor device molded with resin and from which the pin has been removed;

FIGS. 11A and 11D are each a sectional view of another variation of the resin molding semiconductor device with the pin installed therein, FIGS. 11B and 11E are each a perspective view of the pin, and FIGS. 11C and 11F are each a sectional view of a variation of the resin molding semiconductor device molded with resin and from which the pin has been removed;

FIGS. 12A to 12C show a resin molding semiconductor device manufactured by a method and production equipment for manufacturing a resin molding semiconductor device in accordance with a fourth embodiment of the present invention, wherein FIG. 12A is a plan view of the resin molding semiconductor device, FIG. 12B is a simplified sectional view of the resin molding semiconductor device taken along line A-A' in FIG. 12A, and FIG. 12C is a simplified sectional view of the resin molding semiconductor device taken along line B-B' in FIG. 12A;

FIGS. 14A to 14C are drawings of a conventional resin molding semiconductor device, wherein FIG. 14A is a plan view of the resin molding semiconductor device not divided yet, FIG. 14B is a simplified sectional view of the resin molding semiconductor device taken along line A-A' in FIG. 14A, and FIG. 14C is an enlarged plan view of a portion B in FIG. 14A.

DESCRIPTION OF THE EMBODIMENTS

Description will be given below of a resin molding semiconductor device, a method for manufacturing the resin molding semiconductor device, and a production equipment of the resin molding semiconductor device which equipment is used for the manufacturing method.

Figure 1A:
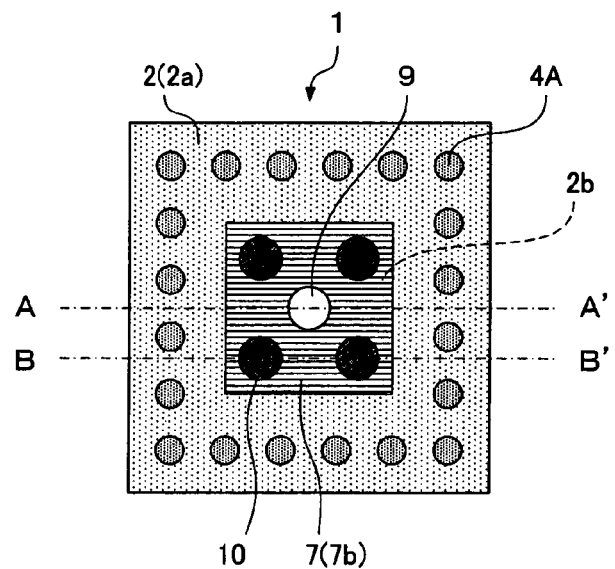
Figure 1B:
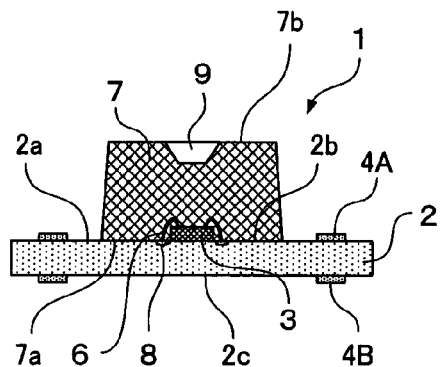
Figure 1C:
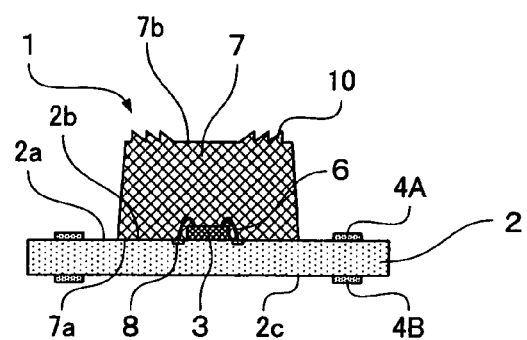

FIGS. 1A to 1C show a resin molding semiconductor device manufactured by a method and production equipment for manufacturing a resin molding semiconductor device in accordance with a first embodiment of the present invention. FIG. 1A is a plan view of the resin molding semiconductor device. FIG. 1B is a simplified sectional view of the resin molding semiconductor device taken along line A-A' in FIG. 1A. FIG. 1C is a simplified sectional view of the resin molding semiconductor device taken along line B-B' in FIG. 1A.

As shown in FIGS. 1A to 1C, a substrate 2 of a resin molding semiconductor device 1 has, on a front surface portion (in the condition shown in FIGS. 1A to 1C, the front surface portion corresponds to what is called a top surface) 2a, that is, one surface thereof, a chip mounting area 2b in which a semiconductor element 3 is mounted, an electrode 8 disposed around the outer periphery of the chip mounting area 2b in a plan view of the front surface portion 2a, front surface portion side external terminals 4A disposed around the outer periphery of the electrode 8, and back surface portion side external terminals 4B on a back surface portion (in the condition shown in FIGS. 1A to 1C, the back surface portion corresponds to what is called a bottom surface) located opposite the front surface portion 2a of the substrate 2. The semiconductor element 3 having an electrode (not shown) is mounted in the chip mounting area 2b of the substrate 2. The electrode 8 on the substrate 2 is electrically connected to the electrode on the semiconductor element 3 via a wire 6 serving as a connector. The following area is covered with a molding resin: the semiconductor elements 3, the front surface portion 2a of the substrate 2 except for the area in which the front surface portion side external terminals 4A are provided, that is, the chip mounting area 2b and electrode 8, and the wire 6 (a portion of the resin molding semiconductor device which is formed of the molding resin is hereinafter referred to as a molding resin portion 7).

A resin injection port impression 9 with the molding resin injected therein and an air release port impression 10 from which air is released during resin injection are present in a top surface portion 7b (corresponding to what is called a top surface) located opposite a bottom surface portion 7a that is in tight contact with the front surface portion 2a of the substrate 2; each of the resin injection port impression 9 and the air release port impression 10 has a recessed and projecting shape.

Figure 2A:
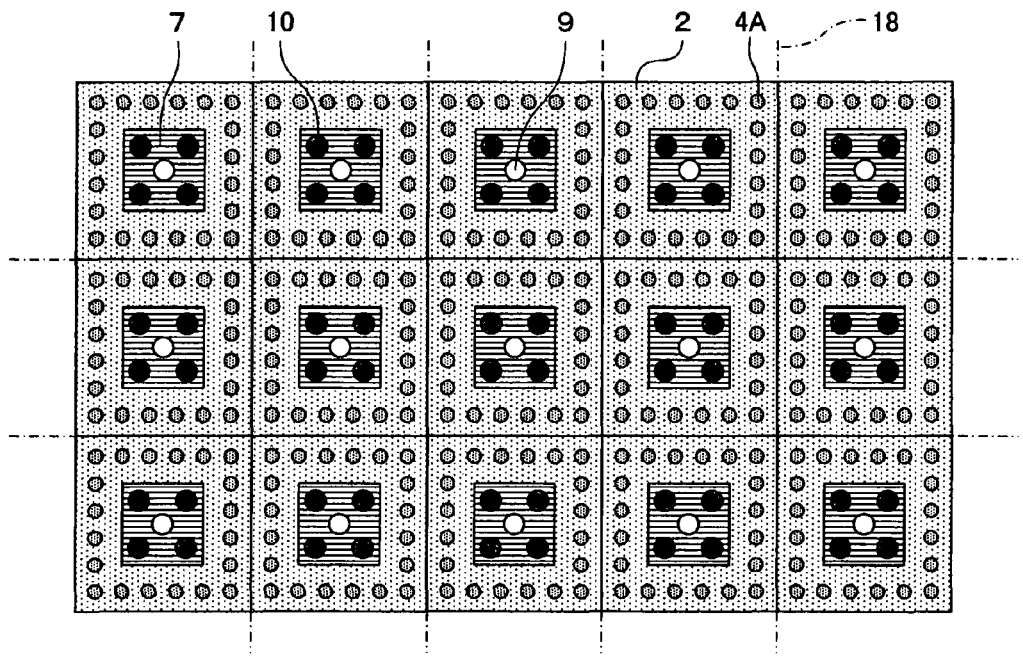
FIG. 2A is a plan view of the resin molding semiconductor device not divided yet.
Figure 2B:
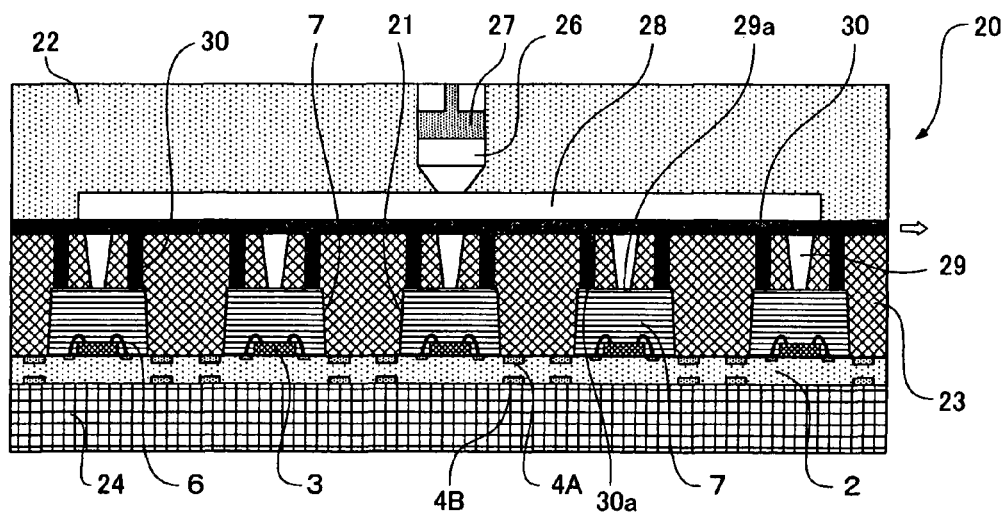
FIG. 2B is a sectional view of the resin molding semiconductor device and a production equipment during a resin molding process.

The resin molding semiconductor device 1 is finally commercialized as the substrate 2 comprising one semiconductor element 3. However, during a manufacturing process, as shown in FIGS. 2A and 2B, a plurality of semiconductor elements 3 are manufactured so as to be arranged both in a vertical direction and in a horizontal direction in a plan view. Subsequently, the substrate 2 is cut along cutting lines 18 and divided into smaller substrates 2 comprising respective semiconductor elements 3 to be commercialized.

Now, with reference to FIGS. 3A to 3E, 4A to 4E, and 2A and 2B, description will be given of a method for manufacturing the resin molding semiconductor device 1.

Figure 3A:
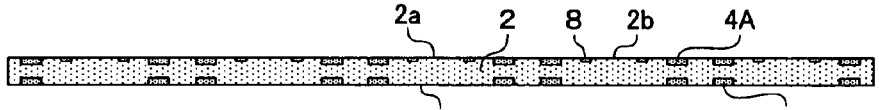
FIGS. 3A to 3E are sectional views showing processes for the resin molding semiconductor device.

First, an electrode 8 is formed in the front surface portion 2a of the substrate 2 having the chip mounting area 2b, in which the semiconductor element 3 is mounted, at a position around the outer periphery of the chip mounting area 2b. Front surface side external elements 4A are formed on the front surface portion 2a of the substrate 2 around the outer periphery of the electrode 8. The electrode 8 and the front surface portion side external terminals 4A may be formed in any order. Further, back surface portion side external terminals 4B are formed on the back surface portion 2c of the substrate 2. FIG. 3A shows that the chip mounting area 2b, electrode 8, front surface portion side external terminals 4A, back surface portion side external terminals 4B have already been formed on the substrate 2. The back surface portion side external terminals 4B may be formed after a resin molding process described below. The substrate 2 is, for example, an organic or ceramic multilayer substrate having external terminals not only on the back surface portion (bottom surface) 2c but also on the front surface portion (top surface) 2a. The substrate 2 is required for a structure such as POP (Package On Package).

Figure 3B:
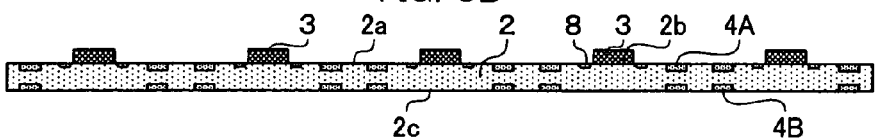
Figure 3C:
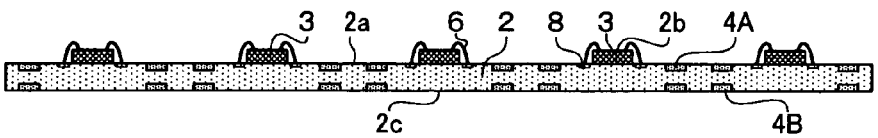

Now, as shown in FIG. 3B, the semiconductor element 3 with the electrode (not shown) is mounted in and secured to the chip mounting area 2b of the substrate 2. Then, as shown in FIG. 3C, the electrode 8 on the substrate 2 is electrically connected to the electrode on the semiconductor element 3 via a wire 6.

Figure 3D:
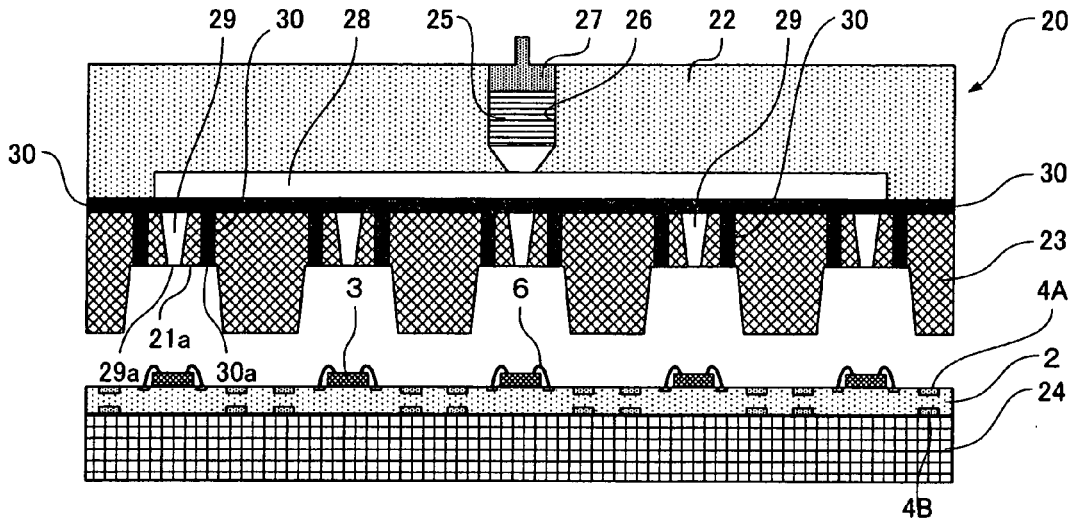
Figure 3E:
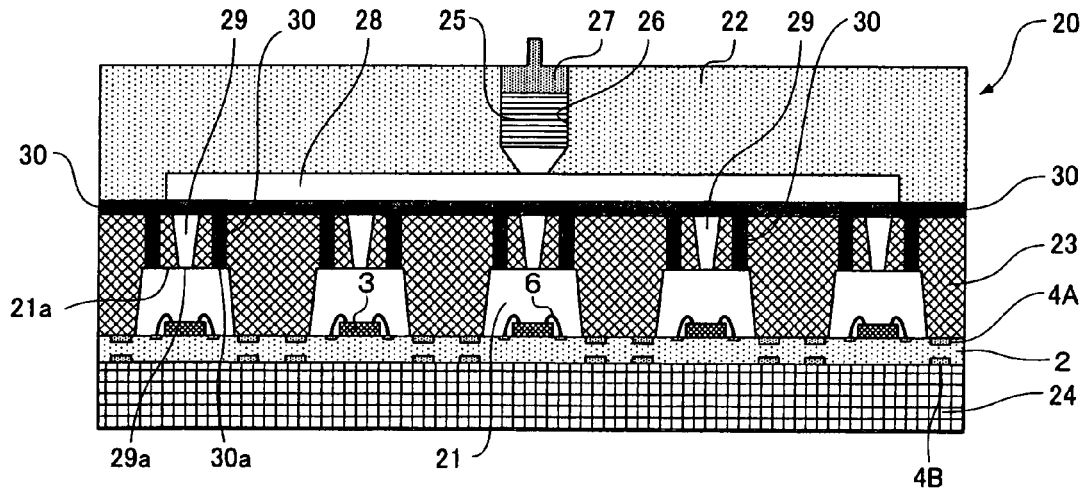

Subsequently, resin molding is performed. Here, FIGS. 2B, 3D, and 3E schematically show how resin molding is performed on the substrate 2. The substrate 2 with the semiconductor element 3 mounted thereon is placed, before resin molding, in production equipment for resin molding. The production equipment comprises a resin molding mold 20 having a cavity 21 that is a molding resin injection space. In the present embodiment, the mold 20 is divided into an upper mold 22, an intermediate mold 23, and a lower mold 24. The upper mold 22 and the intermediate mold 23 are disposed so as to be able to elevate from and lower to the lower mold 24.

The upper mold 22 has a collecting portion (what is called a pot) 26 in which a molding resin 25 is temporarily collected, a plunger 27 that is movable forward and backward to push out the molding resin 25 collected in the collecting portion 26, and a runner 28 constituting a path through which the molding resin 25 is pushed out. The intermediate mold 23 has a gate 29 that is a passage through which the molding resin 25 fed through the runner 28 is introduced into each cavity 21, and an air discharge passage 30 through which air from the cavity is released during resin injection. A port of the gate 29 which communicates with the cavity 21 is a resin injection port 29a. A port of the air discharge passage 30 which communicates with the cavity 21 is an air release port 30a.

As shown in FIGS. 3D and 3E, the resin injection port 29a and the air release port 30a are located opposite the cavity 21 and formed in a top surface portion 21a (more specifically, that area of the intermediate mold 23 constituting the cavity 21 which corresponds to the top surface portion 21a of the cavity) of the cavity 21 which is located opposite the front surface portion 2a of the substrate 2. Although not shown, the resin injection port 29a is formed in a central portion of the top surface portion 21a of the cavity 21 in a plan view. Further, for example, a plurality of (in the present embodiment, four) air release ports 30a are formed in the top surface portion 21a of the cavity 21 in the vicinity of the resin injection port 29a in a plan view (in which the device is viewed along the thickness direction of the substrate 1 or the thickness direction of the molding resin portion 7).

Figure 4A:
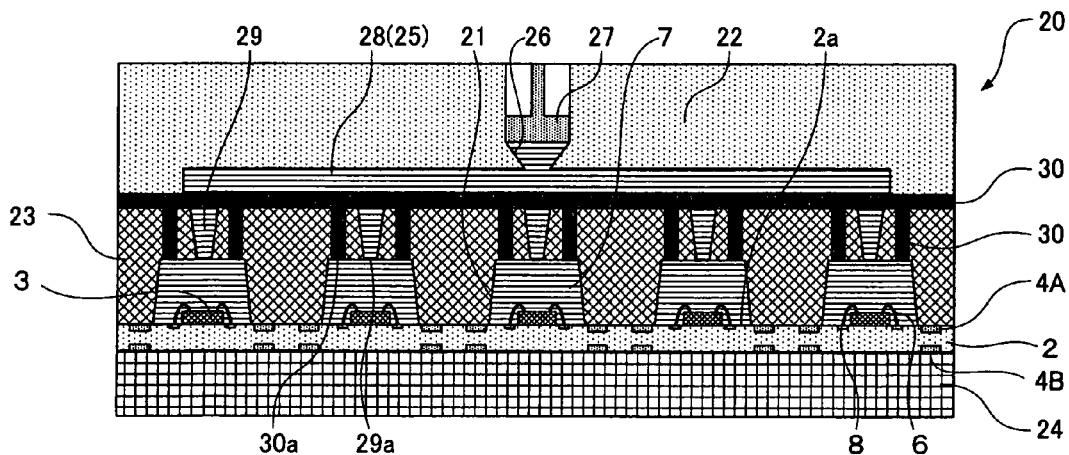
FIGS. 4A to 4E are sectional views showing processes for the resin molding semiconductor device.

The mold 20 having the above structure is used for the process. First, as shown in FIG. 3D, the substrate 2 with the semiconductor element 3 mounted thereon is placed on the lower mold 24. The intermediate mold 23 and the upper mold 22 are then lowered. As shown in FIGS. 3E and 4A, with the space of the cavity 21 formed, the plunger 27 is pushed in to inject the molding resin 25. This allows the molding resin 25 to flow into the cavity 21 through the resin injection port 29a, formed in the top surface portion 21a of the cavity 21, while releasing air from the air release ports 30a, formed in the top surface portion 21a of the cavity 21, and from the air discharge path 30. The molding resin 25 (molding resin portion 7) thus covers the semiconductor elements 3, the front surface portion 2a of the substrate 2 except for the front surface portion side external terminals 4A, that is, the chip mounting area 2b and electrode 8, and the wire 6 for batch molding.

To inject the molding resin 25, a thermosetting epoxy resin (tablet) is introduced and melted in the collecting portion 26 of the mold 20 heated to 120 to 200° C. and the plunger 27 is then pushed in to eject the molding resin 25. The ejected molding resin 25 passes through the runner 28 and is then injected into a product portion (cavity 21) through the resin injection port 29a of the gate 29. The injected molding resin 25 is hardened in a predetermined hardening time (30 to 120 seconds).

Figure 4B:
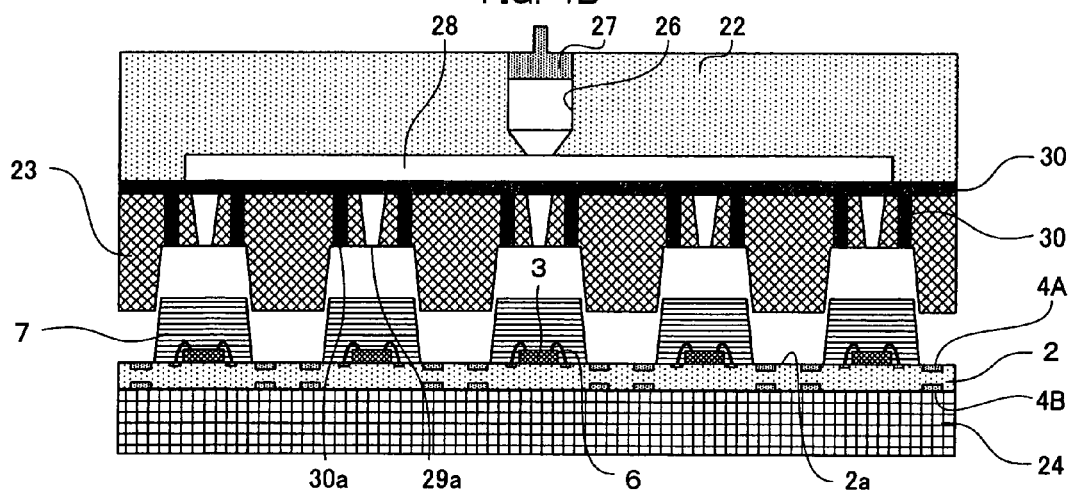
Figure 4C:
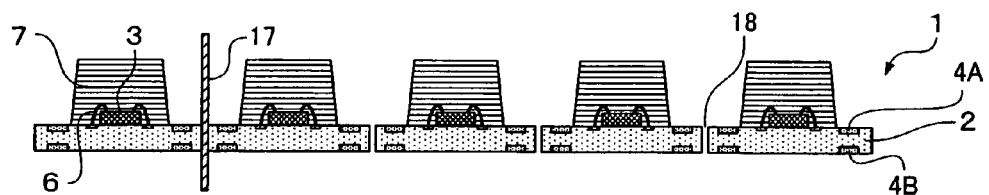
Figure 4D:
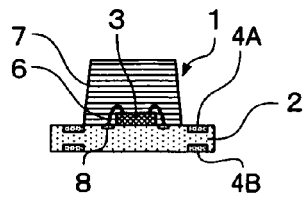

After the molding resin 25 hardens, as shown in FIG. 4B, the intermediate mold 23 and the upper mold 22 are elevated to remove the substrate 2 molded with the resin. As shown in FIGS. 4C and 4D, a cutter 17 such as a dicing saw is used to cut the substrate 2 along cutting lines 18 to form individual resin molding semiconductor devices 1.

This allows the resin molding semiconductor devices 1 to be manufactured. In this case, during the resin molding process, the molding resin 25 is injected from the resin injection port 29a, formed in the top surface portion 21a of the cavity 21. Even when the molding resin 25 is injected, only a small amount of molding resin 25 flows along the front surface portion 2a of the substrate 2. Thus, even if the wire 6 is used as a connector connecting the electrode 8 on the substrate 2 to the electrode on the semiconductor element 3, it can be prevented from being swept away by the molding resin 25 and contacting the adjacent wire 6.

Further, during the resin molding process, in particular, the molding resin 25 is injected from the resin injection port 29a, and air in the cavity 21 is discharged from the air release port 30a. After the air in the cavity 21 is discharged, the molding resin 25 flows out from the air release port 30a. In this case, as shown in FIG. 1C, a resin burr is formed in an area corresponding to the air release port 30a, as an air release port impression 10. A resin burr may be formed in an area corresponding to the resin injection port 29a, as a resin injection port impression 9.

However, even if the resin burr remains in the area corresponding to the air release port 30a, as the air release port impression 10 or the resin burr remains in the area corresponding to the resin injection port 29a, as the resin injection port impression 9, it is formed on the top surface portion 7b of the molding resin portion 7, which is located away from the front surface portion 2a of the substrate 2. This makes it possible to prevent resin burrs from adhering to the front surface portion side external terminals 4A on the front surface portion 2a of the substrate 2. Resin molding semiconductor devices 1 can thus be manufactured with a high yield, allowing productivity to be improved. Further, the front portion surface side external terminals 4A can be freely arranged on the front surface portion 2a of the substrate 2. This advantageously enables the degree of freedom of arrangement to be increased.

This arrangement also allows both resin burs as the air release port impression 10 and resin injection port impression 9 to be formed on the top surface portion 7b of the molding resin portion 7. Thus, even if resin burrs splash, the amount of resin burrs adhering to the front surface portion 2a of the substrate 2 can also be minimized.

Figure 4E:
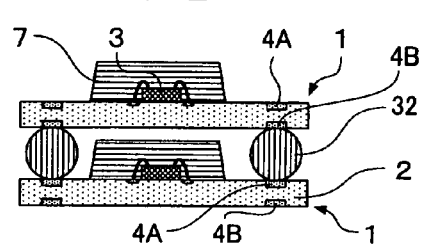

If the resin molding semiconductor device 1 is used to form a structure such as POP (Package On Package), a plurality of resin molding semiconductor devices 1 are stacked and the front surface portion side external terminals 4A or back surface portion side external terminals 4B on the vertically stacked resin molding semiconductor devices 1 are electrically connected together using solder balls 32 or the like as shown in FIG. 4E.

In the description of the above embodiment, to electrically connect the electrode of the semiconductor element 3 to the electrode 8 of the substrate 2, the wire bond scheme is used which involves securing the back surface portion of the semiconductor element 3 to the substrate 2 and joining the electrodes of the substrate 2 and semiconductor element 3 together via the wire 6 as a connector. However, the present invention is not limited to this. A flip chip connection scheme may be used which involves forming a bump on the electrode of the semiconductor element 3 as a connector and electronically connecting the bump to the electrode 8 of the substrate 2.

Figure 5A:
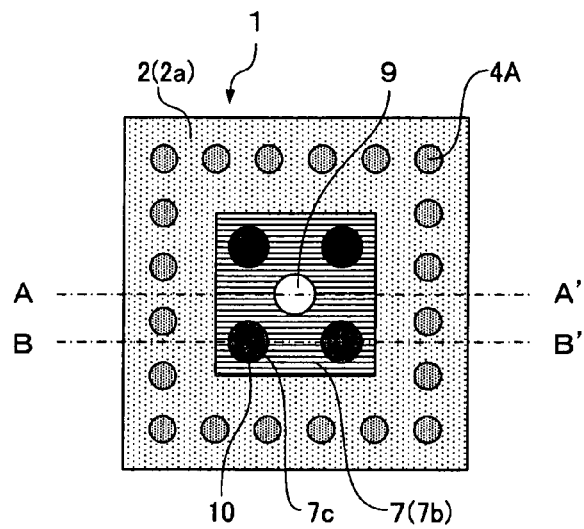
Figure 5B:
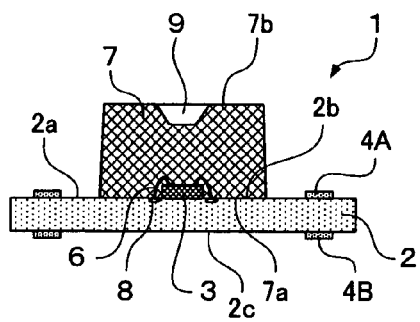
Figure 5C:
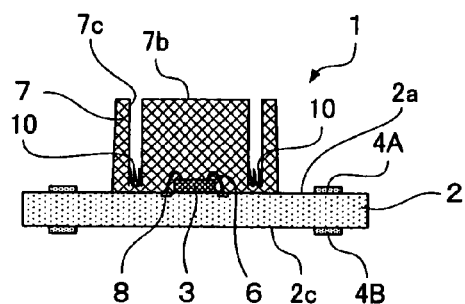
Figure 6:
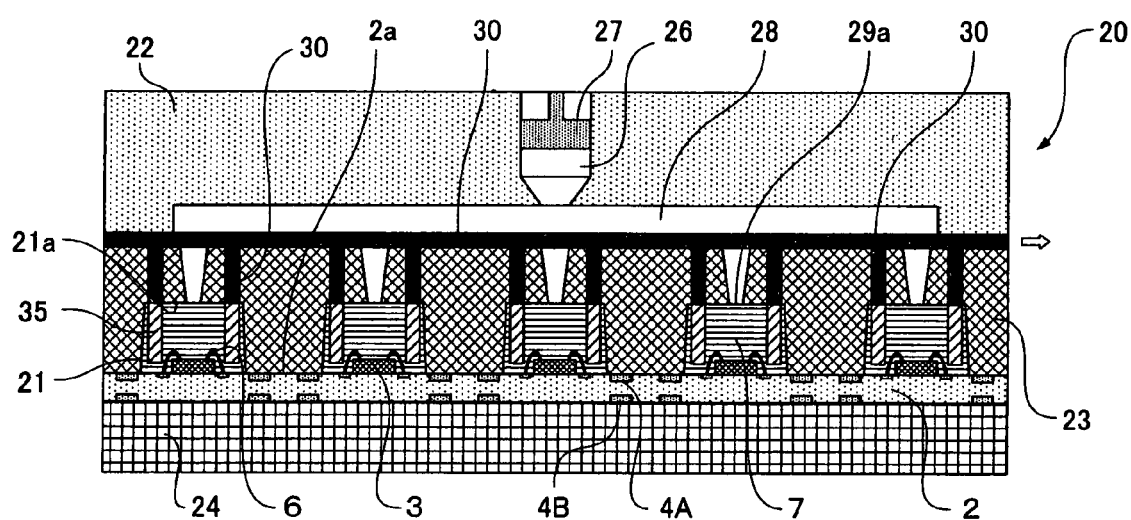
FIG. 6 is a sectional view of the resin molding semiconductor device and a production equipment during a resin molding process.

FIGS. 5A to 5C show a resin molding semiconductor device manufactured by a method and production equipment for manufacturing a resin molding semiconductor device in accordance with a second embodiment of the present invention. FIG. 5A is a plan view of the resin molding semiconductor device. FIG. 5B is a simplified sectional view of the resin molding semiconductor device taken along line A-A' in FIG. 5A. FIG. 5C is a simplified sectional view of the resin molding semiconductor device taken along line B-B' in FIG. 5A. This resin molding semiconductor device is the same as the resin molding semiconductor device 1 shown in FIGS. 1A to 1C except for the position where the air release port impression 10 is formed. The difference will be described below.

As shown in FIGS. 5A to 5C, in the resin molding semiconductor device 1, recessed portions 7c recessed to the vicinity of the bottom surface portion 7a are formed in the top surface portion 7b of the molding resin portion 7, which is located opposite the bottom surface portion 7a, which contacts the front surface portion 2a of the substrate 2. The air release port impression 10 from which air is released during resin injection is present at the bottom of each of the recessed portions 7c. The resin injection port impression 9 with the molding resin injected therein is present in the top surface portion 7b (portion constituting the top surface) of the molding resin portion 7 as is the case with the above embodiment. In the present embodiment, the recessed portions 7c are formed in the vicinity of the respective corners of the molding resin portion 7, which appears rectangular in a plan view.

A production equipment used for a resin molding process for the resin molding semiconductor device 1 has not only the structure shown in FIGS. 2 to 4, described above, but also a hollow pin 35 additionally secured to a bottom surface of the intermediate mold 23 as auxiliary intermediate mold. The pin 35 is disposed so as to extend from the top surface portion 21a of the cavity 21 to the vicinity of the front surface portion 2a of the substrate 2 and through the cavity 21. An air releasing passage 36 (see FIGS. 7A and 7B) penetrating each pin 35 in the axial direction of the pin is joined to the air discharge path 30 in the intermediate mold 23. In the present embodiment, as shown in FIGS. 7A and 7B, a draft-angle inclined surface 35a is formed around an outer peripheral surface of the pin 35 and is tapered downward so that the cross section in the outer peripheral surface decreases as it approaches the front surface portion 2a of the substrate 2. This allows the pin 35 to be easily removed after the resin molding process.

The mold 20 configured as described above is used for resin molding. Then, as shown in FIGS. 5C, 7A, and 7B, the recessed portions 7c, which are recessed toward the bottom surface portion 7a, are formed in the top surface portion 7b of the molding resin portion 7. The air release port impression 10, from which air is released during resin injection, is present at the bottom of each of the recessed portions 7c. The resin injection port impression 9 with the molding resin injected therein is present on the top surface portion 7b (portion constituting the top surface) of the molding resin portion 7 as is the case with the above embodiment.

With the manufacturing method and arrangement described above, even if a resin burr remains, as the air release port impression 10, in an area corresponding to the air release port 36a located at the tip of the air releasing passage 36 in the pin 35 or a resin burr remains in an area corresponding to resin injection port 29a as the resin injection port impression 9, it is formed on the top surface portion of the molding resin portion 7, which is located away from the front surface portion 2a of the substrate 2, or at the bottom of the recessed portion 7c of the molding resin portion 7. This makes it possible to prevent resin burrs from adhering to the front surface portion side external terminals 4A on the front surface portion 2a of the substrate 2. Resin molding semiconductor devices 1 can thus be manufactured with a high yield, allowing productivity to be improved. Further, the resin burr of the air release port impression 10 remaining at the bottom of the recessed portion 7c is thin and adheres to the front surface portion 2a of the substrate 2. This advantageously makes the resin burr unlikely to splash.

Further, the molding resin portion 7 is provided with the recessed portion 7c and thus has a relatively deformable shape. Compared to the case where the molding resin portion 7 has no recessed portion 7c, this arrangement makes it possible to relax stress resulting from hardening reaction shrinkage and thermal shrinkage which may occur during resin molding. This in turn enables a reduction in the warpage of the molding resin portion 7 and thus the molding resin semiconductor device 1.

In the above arrangement, the draft-angle inclined surface 35a is formed around the outer peripheral surface of each pin 35. This allows the pin 35 to be easily removed during mold releasing after the resin molding process, improving working efficiency.

Figure 8A:
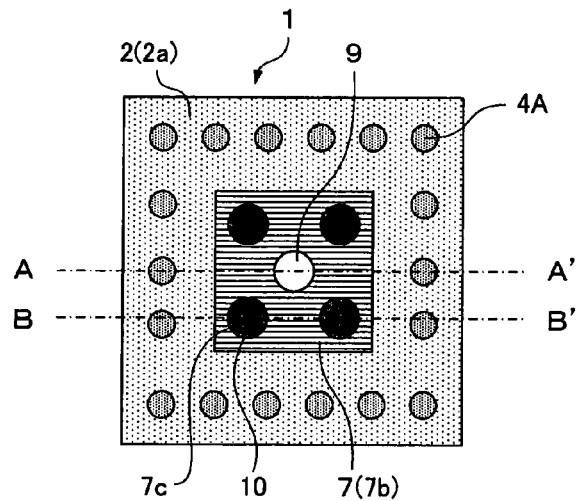
Figure 8B:
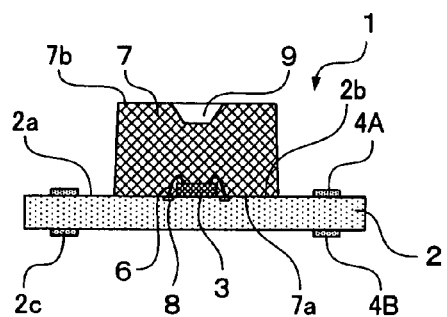
Figure 8C:
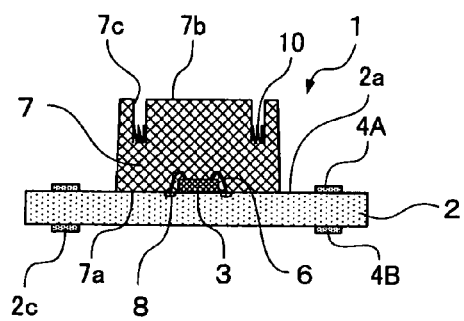

FIGS. 8A to 8C show a resin molding semiconductor device manufactured by a method and production equipment for manufacturing a resin molding semiconductor device in accordance with a third embodiment of the present invention. FIG. 8A is a plan view of the resin molding semiconductor device. FIG. 8B is a simplified sectional view of the resin molding semiconductor device taken along line A-A' in FIG. 8A. FIG. 8C is a simplified sectional view of the resin molding semiconductor device taken along line B-B' in FIG. 8A. This resin molding semiconductor device is the same as the resin molding semiconductor device 1 shown in FIGS. 5A to 5C except for the position where the air release port impression 10 is formed. The difference will be described below.

As shown in FIGS. 8A to 8C, also in the resin molding semiconductor device 1, recessed portions 7c recessed toward the bottom surface portion 7a are formed in the top surface portion 7b of the molding resin portion 7, which is located opposite the bottom surface portion 7a, which contacts the front surface portion 2a of the substrate 2. However, the recessed portions 7c are recessed only to an intermediate portion of the molding resin portion 7 in thickness direction of the portion 7. The air release port impression 10 from which air is released during resin injection is present at the bottom of each of the recessed portions 7c. In the present embodiment, the recessed portions 7c are formed in the vicinity of the respective corners of the molding resin portion 7, which appears rectangular in a plan view.

In a production equipment used for a resin molding process for the resin molding semiconductor device 1, the hollow pin 35 (see FIG. 9), secured to the bottom surface of the intermediate mold 23 as an auxiliary intermediate mold, is shorter than those in the second embodiment.

Figure 9B:
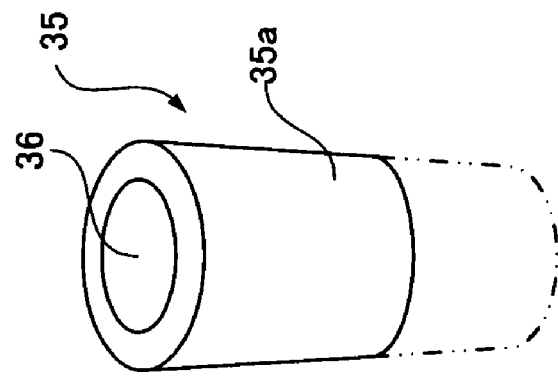
FIGS. 9A and 9B are a sectional view of the resin molding semiconductor device with pins installed therein and the pin, respectively.
Figure 9A:
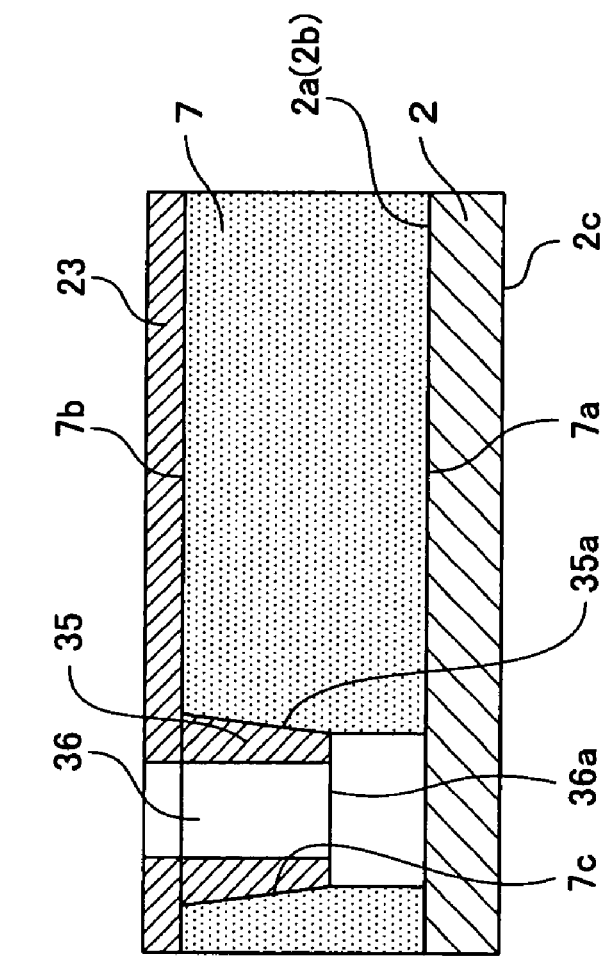

The mold 20 configured as described above is used for resin molding. Then, as shown in FIGS. 8C, 9A, and 9B, recessed portions 7c are formed in the top surface portion 7b of the molding resin portion 7 so as to be recessed to an intermediate point corresponding to the substantial half of the thickness from the top surface portion 7b to the bottom surface portion 7a. The air release port impression 10 from which air is released during resin injection is present at the bottom of each of the recessed portions 7c. The resin injection port impression 9 with the molding resin injected therein is present on the top surface portion 7b (portion constituting the top surface) of the molding resin portion 7 as is the case with the above embodiment.

With the manufacturing method and arrangement described above, even if a resin burr remains, as the air release port impression 10, in an area corresponding to the air release port 36a located at the tip of the air releasing passage 36 in the pin 35 or a resin burr remains in an area corresponding to resin injection port 29a as the resin injection port impression 9, it is formed on the top surface portion of the molding resin portion 7, which is located away from the front surface portion 2a of the substrate 2, or at the bottom of the recessed portion 7c of the molding resin portion 7. This makes it possible to prevent resin burrs from adhering to the front surface portion side external terminals 4A on the front surface portion 2a of the substrate 2. Resin molding semiconductor devices 1 can thus be manufactured with a high yield, allowing productivity to be improved. Further, the front surface side external terminals 4A can be freely arranged on the front surface portion 2a of the substrate 2. This advantageously enables the degree of freedom of arrangement to be increased.

Further, the molding resin portion 7 is provided with the recessed portions 7c and thus has a relatively deformable shape. Compared to the case where the molding resin portion 7 has no recessed portion 7c, this arrangement makes it possible to relax stress resulting from hardening reaction shrinkage and thermal shrinkage which may occur during resin molding. This in turn enables a reduction in the warpage of the molding resin portion 7 and thus the molding resin semiconductor device 1.

Moreover, in this arrangement, the pin 35 is short and does not reach the substrate 2. This makes it possible to avoid bringing the pin 35 into contact with the substrate 2 to crack the substrate 2 if the substrate 2 is thicker owing to a variation in substrate thickness. This in turn prevents possible inappropriate clamping (cracks or resin leakage) resulting from a variation in the thickness of the substrate 2 in clamping the mold during resin molding, allowing resin molding semiconductor devices 1 to be more appropriately manufactured.

Further, during resin molding, air escapes through the air release port 36a, located at the tip of the air releasing passage 36 in the pin 35, which corresponds to the substantially intermediate portion of the molding resin portion 7 in its thickness direction. Consequently, during resin molding, air is appropriately emitted from the central portion of the molding resin portion 7, where air is most unlikely to escape. This enables inhibition of possible internal voids caused by remaining air.

Alternatively, the production equipment used for the resin molding process for the resin molding semiconductor device 1 may use the pin 35 partly notched to form air release ports 37 as shown in FIGS. 10A to 10I and 11A to 11C. That is, as shown in FIGS. 10A to 10C, a plurality of round hole-shaped air release ports 37 (or one air release port 37) (the shape of the hole is not limited to this) may be formed in an upper portion of the pin 35 so as to communicate with the air releasing passage 36. Alternatively, as shown in FIGS. 10D to 10F, a plurality of round hole-shaped air release ports 37 (or one air release port 37) (the shape of the hole is not limited to this) may be formed in an intermediate portion of the pin 35 so as to communicate with the air releasing passage 36. Alternatively, as shown in FIGS. 10G to 10I, a plurality of round hole-shaped air release ports 37 (or one air release port 37) (the shape of the hole is not limited to this) may be formed in a lower portion of the pin 35 so as to communicate with the air releasing passage 36. Alternatively, as shown in FIGS. 11A to 11C, a plurality of round hole-shaped air release ports 37 (the shape of the hole is not limited to this) may be formed all over the pin 35, that is, from the upper to lower portions of the pin 35, so as to communicate with the air releasing passage 36. Alternatively, as shown in FIGS. 11D to 11F, a notched groove-shaped air release port 37 may be formed all over the upper or intermediate portion of the pin 35 so as to communicate with the air releasing passage 36 (FIG. 11B shows that the notched groove-shaped air release port 37 is formed in the upper portion of the pin 35). Also in this case, a draft-angle inclined surface 35a is preferably formed which allows the pin 35 to be easily removed after the resin molding process.

Also with the manufacturing method and production equipment described above, even if a resin burr remains in an area of the pin 35 which corresponds to the air release port 37, as the air release port impression 10, or in an area of the pin 35 which corresponds to the resin injection port 29a, as the resin injection port impression 9, it is only formed in an area of the pin 35 which corresponds to the air release port 37 or on the top surface portion 7b of the molding resin portion 7, which is located away from the front surface portion 2a of the substrate 2. This makes it possible to prevent resin burrs from adhering to the front surface portion side external terminal 4A, provided on the front surface portion 2a of the substrate 2. Resin molding semiconductor devices 1 can thus be manufactured with a high yield, allowing productivity to be improved.

If the air release port 37 is formed only in the lower portion of the pin 35, the resin burr of the air release port impression 10 is advantageously unlikely to splash out from the air releasing passage 36 because it is located deep in the air releasing passage 36 in the pin 35.

If the air release port 37 is formed in the intermediate portion of the pin 35, then during resin molding, air escapes through the intermediate portion of the molding resin portion 7 in thickness direction of the portion 7. Thus, during resin molding, air is appropriately emitted from the central portion of the molding resin portion 7, where air is most unlikely to escape. This enables inhibition of possible internal voids caused by remaining air.

In the above embodiment, the illustrated pin 35 is cylindrical. However, the pin 35 need not necessarily be cylindrical but may be shaped like a square or triangle pole which has a polygonal cross section. Also in this case, as described above, the pin 35 preferably has the draft-angle inclined surface 35a on a side surface thereof which is inclined so that its cross section decreases as the inclined surface starts from the intermediate mold 23 (the top surface of the pin 35) and approaches the front surface portion (the bottom surface of the pin 35) to allow the pin 35 to be easily removed in removing the mold after resin molding. Further, if hole-shaped air release ports 37 are formed in a partial area of the cylindrical pin 35, they may be formed at the respective positions all along the circumference of the pin 35. However, the number of holes and opening areas of the holes are desirably adjusted so as to suit the air discharge condition during resin molding.

Figure 12A:
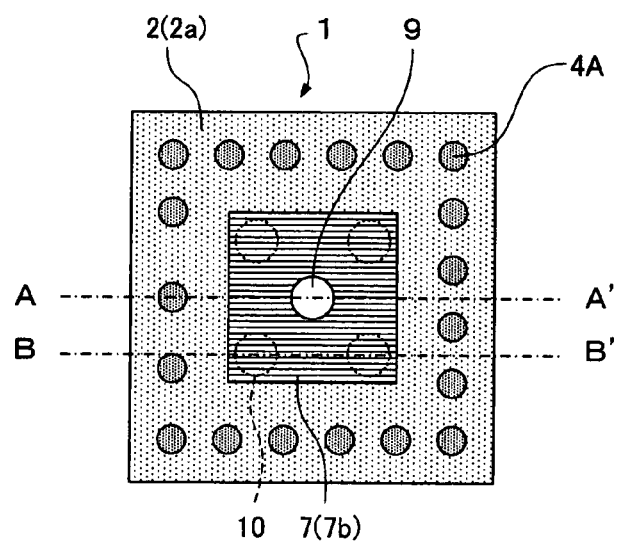
Figure 12B:
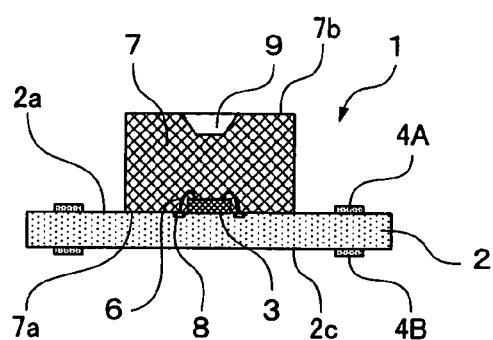
Figure 12C:
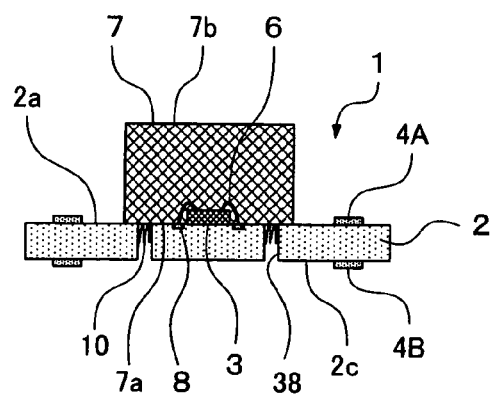
Figure 13A:
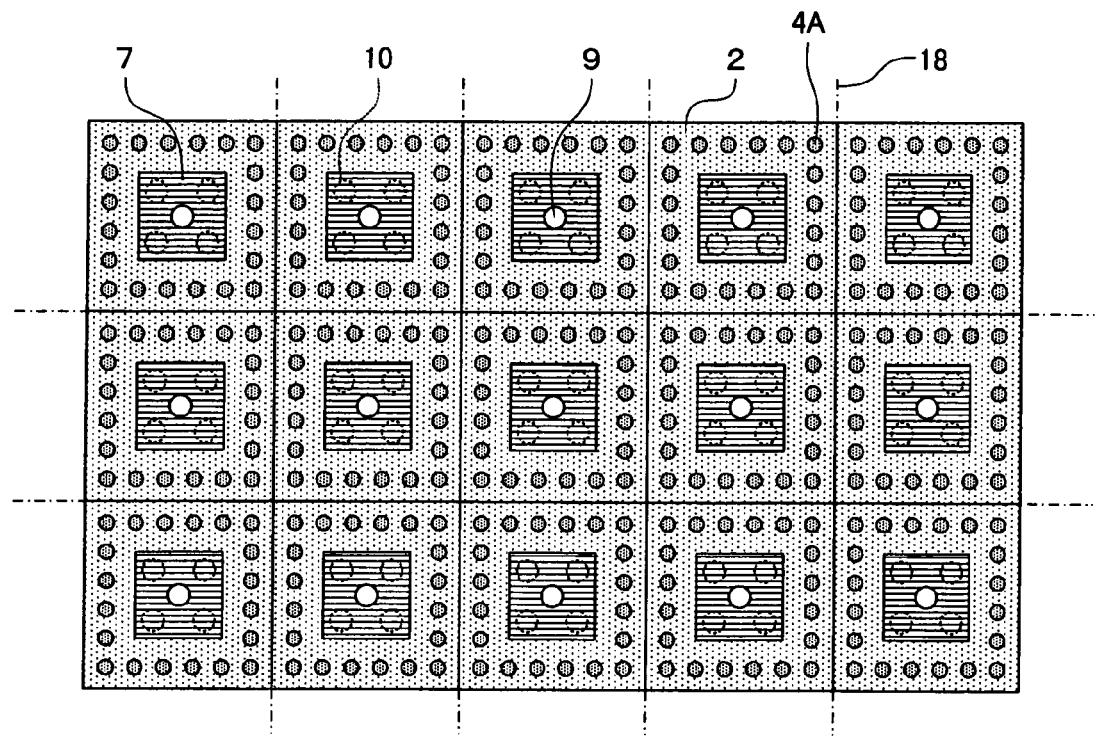
FIG. 13A is a plan view of the resin molding semiconductor device not divided yet.
Figure 13B:
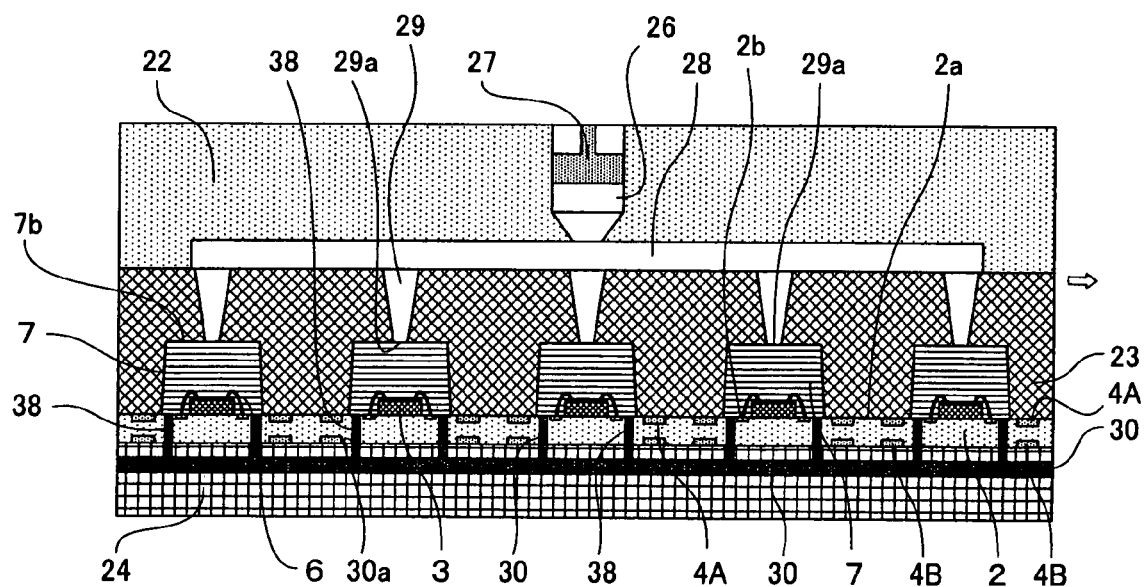
FIG. 13B is a sectional view of the resin molding semiconductor device and a production equipment during a resin molding process.
Figure 14A:
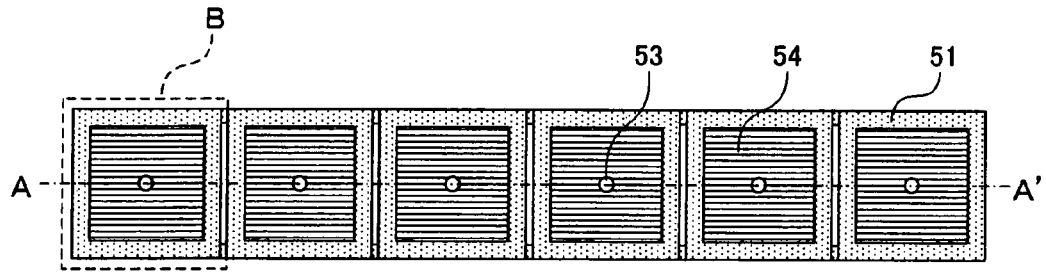
Figure 14B:
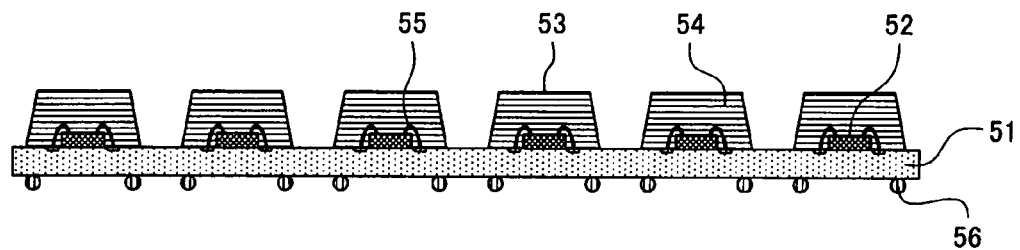
Figure 14C:
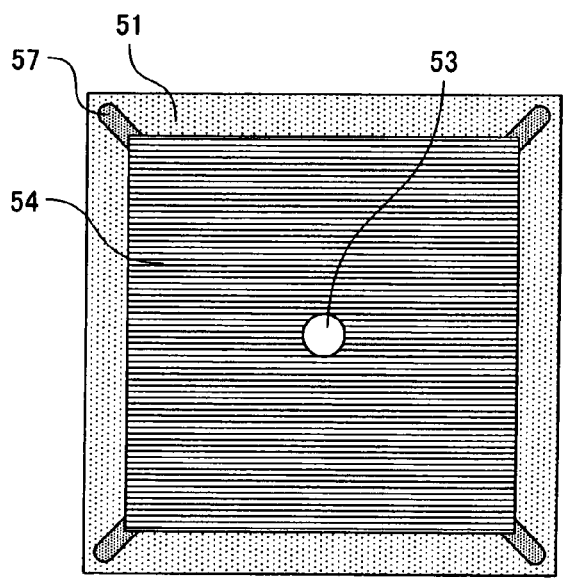
Figure 15:
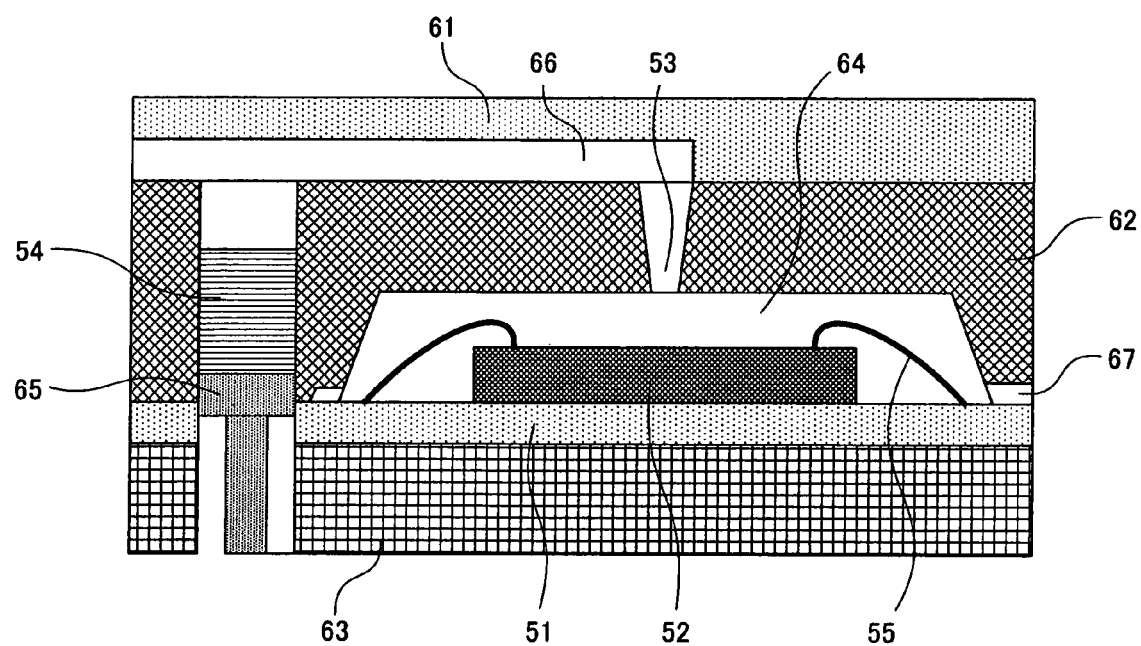
FIG. 15 is a sectional view of the conventional resin molding semiconductor device and a production equipment during a resin molding process.

FIGS. 12A to 12C and 13A and 13B show a resin molding semiconductor device manufactured by a method and production equipment for manufacturing a resin molding semiconductor device in accordance with a fourth embodiment of the present invention. FIG. 12A is a plan view of the resin molding semiconductor device. FIG. 12B is a simplified sectional view of the resin molding semiconductor device taken along line A-A' in FIG. 12A. FIG. 12C is a simplified sectional view of the resin molding semiconductor device taken along line B-B' in FIG. 12A.

The resin molding semiconductor device 1 has through-holes 38 formed in areas in the substrate 2 which correspond to corners of the back surface portion of the molding resin portion 7, which appears rectangular in a plan view; the through-holes 38 penetrate the substrate 2 in thickness direction of the substrate 2.

The air release port impressions 10 in the molding resin portion 7 from which air is released during resin injection are present in areas of the molding resin portion 7 which correspond to the through-holes 38 in the substrate 2.

In a production equipment used for a resin molding process for the resin molding semiconductor device 1, the air discharge passage 30 and air release ports 30a, from which air from the cavity is released during resin injection, are formed at positions in the lower mold 24, not in the intermediate mold 23, where they are joined to the thorough-holes 38 in the substrate 2.

During the resin molding process, the mold 20 is used as the production equipment. The substrate 2 with the semiconductor elements 3 mounted thereon is disposed inside the mold 20 with the cavity 21, a molding resin injection space, formed thereon. The molding resin 25 is injected into the cavity 21 from the resin injection port 29a, formed in the top surface portion 21a of the cavity 21, while air is being released through the air releasing through-holes 38, formed through the substrate 2 in thickness direction of the substrate 2, the air release ports 30a, formed so as to connect to the substrate back surface portion-side openings of the through-holes 38, and the air discharge path 30, which is continuous with the air release ports 30a. The molding resin 25 thus covers the semiconductor elements 3, the front surface portion 2a of the substrate 2 except for the front surface portion side external terminals 4A, that is, the chip mounting area 2b and electrode 8, and the wire 6.

This method injects and fills the molding resin 25 into the cavity 21 in the mold 20 through the resin injection port 29a, formed in the top surface portion 21a, while discharging air in the cavity 21 through the air releasing through-holes 38, formed through the substrate 2 in thickness direction of the substrate 2, the air release ports 30a, formed so as to connect to the substrate back surface portion-side openings of the through-holes 38, and the air discharge path 30, which is continuous with the air release ports 30a. Thus, even if a resin burr (resin injection port impression 9 or air release port impression 10) remains in the resin injection port 29a in the molding resin potion 7 or an area of the molding resin portion 7 which corresponds to the air release port 30a, it is only formed on the top surface portion of the molding resin portion 7, which is located away from the front surface portion 2a of the substrate 2, or in the air releasing through-hole 38 in the substrate 2. This makes it possible to prevent resin burrs from adhering to the front surface portion side external terminal 4A, provided on the front surface portion 2a of the substrate 2, or to the back surface portion side external terminals 4B. Resin molding semiconductor devices 1 can thus be manufactured with a high yield, allowing productivity to be improved.

In the resin molding semiconductor device 1 manufactured by this manufacturing method, a resin bur as the air release port impression 10 is formed in the air releasing through-hole 38 in the substrate 2 and not in the top surface portion of the molding resin portion 7. Thus even if various marks are applied to the top surface portion of the molding resin portion 7 as required, many areas are advantageously available for the marks.

What is claimed is:

1. A resin molded semiconductor device comprising:
    a semiconductor packaging substrate having a first area on a front surface of said semiconductor packaging substrate, a second area laterally outside of an outer periphery of the first area on the front surface, and a back surface opposite the front surface,
    a semiconductor element on the first area on the front surface,
    an electrode on an outer periphery of the semiconductor element on the first area on the front surface,
    a first external terminal on the second area on the front surface,
    a second external terminal on the back surface,
    a connector electrically connecting the electrode to the semiconductor element,
    a resin molded portion covering the first area including the semiconductor element and the connector,
    wherein the resin molded portion has:
    a top surface substantially parallel to the front surface of the semiconductor packaging substrate,
    a recessed portion depressed into the top surface of the resin molded portion, and
    an upwardly projecting portion of the top surface of the resin molded portion,
    wherein the second area of the front surface, and the back surface, of the semiconductor packaging substrate are not covered by the resin molded portion, and the second area is exposed to air.

2. The resin molded semiconductor device according to claim 1,
    wherein the recessed portion is located at a center portion of the top surface and the upwardly projecting portion is located at a corner portion of the top surface.

3. The semiconductor device according to claim 1, wherein the upwardly projecting portion is for releasing gas.

* * * * *